(12) United States Patent
Bosch et al.

(10) Patent No.: US 10,699,872 B2
(45) Date of Patent: Jun. 30, 2020

(54) DISCRIMINATIVE IMAGING TECHNIQUE IN SCANNING TRANSMISSION CHARGED PARTICLE MICROSCOPY

(71) Applicant: FEI Company, Hillsboro, OR (US)

(72) Inventors: Eric Gerardus Bosch, Eindhoven (NL); Ivan Lazic, Eindhoven (NL); Robert Imlau, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/288,305

(22) Filed: Feb. 28, 2019

(65) Prior Publication Data
US 2019/0272974 A1    Sep. 5, 2019

(30) Foreign Application Priority Data
Mar. 1, 2018 (EP) .................................. 18159393

(51) Int. Cl.
*H01J 37/24* (2006.01)
*H01J 37/244* (2006.01)
(Continued)

(52) U.S. Cl.
CPC ............ *H01J 37/244* (2013.01); *G01N 23/04* (2013.01); *H01J 37/222* (2013.01); *H01J 37/28* (2013.01);
(Continued)

(58) Field of Classification Search
CPC ........ H01J 37/244; H01J 37/222; H01J 37/28; H01J 2237/22; H01J 2237/226;
(Continued)

(56) References Cited

U.S. PATENT DOCUMENTS

| 9,312,098 B2 * | 4/2016 | Lazic | .................... H01J 37/244 |
| 10,403,469 B2 * | 9/2019 | Lazic | ..................... H01J 37/28 |
| 10,446,366 B1 * | 10/2019 | Lazic | .................... H01J 37/265 |

FOREIGN PATENT DOCUMENTS

| JP | 2009277619 A | 11/2009 |
| WO | WO-2008152464 A2 | 12/2008 |

OTHER PUBLICATIONS

Extended European Search Report for Application No. 18159393.0, dated Sep. 11, 2018, 5 pages.

* cited by examiner

*Primary Examiner* — David E Smith

(57) ABSTRACT

A method of imaging a specimen in a Scanning Transmission Charged Particle Microscope, comprising the following steps:
  Providing the specimen on a specimen holder;
  Providing a beam of charged particles that is directed from a source through an illuminator so as to irradiate the specimen;
  Providing a segmented detector for detecting a flux of charged particles traversing the specimen, which flux forms a beam footprint on said detector;
  Causing said beam to scan across a surface of the specimen, combining signals from different segments of the detector so as to produce a vector output from the detector at each scan position, and compiling this data to yield an imaging vector field;
  Mathematically processing said imaging vector field by subjecting it to a two-dimensional integration operation, thereby producing an integrated vector field image of the specimen,
specifically comprising:

(Continued)

Using a confined sub-region of said beam footprint to produce said vector output, and the attendant imaging vector field and integrated vector field image.

12 Claims, 8 Drawing Sheets

(51) Int. Cl.
*H01J 37/22* (2006.01)
*H01J 37/28* (2006.01)
*G01N 23/04* (2018.01)

(52) U.S. Cl.
CPC . *G01N 2223/401* (2013.01); *G01N 2223/418* (2013.01); *H01J 2237/22* (2013.01); *H01J 2237/226* (2013.01); *H01J 2237/24465* (2013.01); *H01J 2237/24495* (2013.01); *H01J 2237/2802* (2013.01)

(58) Field of Classification Search
CPC ... H01J 2237/24465; H01J 2237/24495; H01J 2237/2802; G01N 23/04; G01N 2223/401; G01N 2223/418
See application file for complete search history.

DISCRIMINATIVE IMAGING TECHNIQUE IN SCANNING TRANSMISSION CHARGED PARTICLE MICROSCOPY

The invention relates to a method of imaging a specimen in a Scanning Transmission Charged Particle Microscope, comprising the following steps:
  Providing the specimen on a specimen holder;
  Providing a beam of charged particles that is directed from a source through an illuminator so as to irradiate the specimen;
  Providing a segmented detector for detecting a flux of charged particles traversing the specimen, which flux forms a beam footprint on said detector;
  Causing said beam to scan across a surface of the specimen, combining signals from different segments of the detector so as to produce a vector output from the detector at each scan position, and compiling this data to yield an imaging vector field;
  Mathematically processing said imaging vector field by subjecting it to a two-dimensional integration operation, thereby producing an integrated vector field image of the specimen.

The invention also relates to a Scanning Transmission Charged Particle Microscope (STCPM) in which such a method can be performed.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
  In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
  In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, studying ion channeling/ion backscattering (Rutherford Backscattering Spectrometry), etc.

In general, a Charged Particle Microscope (CPM) will comprise at least the following components:
  A particle source, such as a W or $LaB_6$ source, Schottky gun or Cold Field Emission Gun (CFEG) in the case of electrons, or a Liquid Metal Ion Source (LMIS) or Nano-Aperture Ion Source (NAIS) in the case of ions, for instance.
  An illuminator (illumination system; illuminating particle-optical column), which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.
  A specimen holder, on which a specimen under investigation can be held and positioned (e.g. tilted, rotated). If desired, this holder can be moved so as to effect scanning motion of the specimen with respect to the beam. In general, such a specimen holder will be connected to a positioning system. When designed to hold cryogenic specimens, the specimen holder can comprise means for maintaining said specimen at cryogenic temperatures, e.g. using an appropriately connected cryogen vat.
  A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations. In the context of present invention, the employed detector will be segmented (have a sub-divided detection surface), e.g. as in the case of a quadrant detector, pixelated detector (camera sensor), Position Sensitive Detector (PSD), etc.

A Transmission Charged Particle Microscope (TCPM; such as a TEM, for example), will specifically comprise:
  An imaging system (imaging particle-optical column), which essentially takes charged particles that are transmitted through a specimen (plane) and directs (focuses) them onto analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

A method as set forth in the opening paragraph above is exploited in so-called Integrated Vector Field (iVF) imaging, which is described in U.S. Pat. No. 9,312,098 and US 2016/307729 A1, both of which have an inventor in common with the present invention and are incorporated herein by reference. Although this recently developed imaging technique has produced excellent results up to now, the present inventors have sought to improve it further. The results of this endeavor are the subject of the present invention.

It is an object of the invention to produce an improved iVF imaging technique. More specifically, it is an object of the invention that this imaging technique should be usable to improve the iVF imaging quality for multi-elemental specimens.

These and other objects are achieved in a method as set forth in the opening paragraph above, characterized by:
Using a confined sub-region of said beam footprint to produce said vector output, and the attendant imaging vector field and integrated vector field image.

The invention exploits the insight that the beam footprint (basically a bright field (BF) disk or Convergent Beam Electron Diffraction (CBED) disk) on the detector is generally not homogeneous, but instead has an internal structure (essentially associated with diffraction-pattern fringe effects, causing local intensity maxima/minima). In order to "explore" this internal structure using iVF imaging, the invention is able to "zoom in" on a particular sub-region of the footprint, and compile an imaging vector field for this specific sub-region as opposed to one for the entire footprint; the associated iVF image will therefore only contain amplitude/phase information from the specific sub-region concerned. As will be explained in more detail below, this creates the possibility of building up a composite "global" iVF image from a number of contributory "local" iVF images obtained from a variety of different sub-regions within the beam footprint—typically creating a situation in which "the whole is greater than the sum of the parts". For example, in the case of a specimen comprising a variety of elemental constituents of different atomic number Z, it is found that:
Constituents of relatively low Z tend to preferentially scatter transmitted beam particles toward central regions of the beam footprint on the detector;
Constituents of relatively high Z tend to preferentially scatter transmitted beam particles toward peripheral regions of the beam footprint on the detector.
Being able to separately image—and, if desired, subsequently combine iVF images from—different sub-regions of the beam footprint allows signals from lower-Z and higher-Z constituents to be "unmixed" from one another and rendered in greater detail than in conventional, non-discriminative iVF imaging. The skilled artisan will be able to choose the location, size and/or shape of a particular sub-region of the beam footprint in which he is interested.

In a particular embodiment of the invention:
The employed detector is embodied as a pixelated detector comprising an array of pixels;
Said vector output is compiled by:
Comparing pixel values to determine a location for an intensity barycenter of said sub-region of the beam footprint on the detector; and
Expressing coordinate positions of said barycenter on the detector.
Because individual pixels in a pixelated detector are relatively small, and are generally present in relatively large numbers (e.g. in a 2048×2048 array), such an embodiment allows relatively high discriminative resolution as regards its ability to select/isolate a relatively small sub-region of the beam footprint, with its associated intensity barycenter. The barycenter of a selected sub-region can, for example, be relatively easily located using (proprietary) image analysis software. It is also relatively easy to select/adjust a particular sub-region of the footprint, e.g. by using a mouse-controlled shaping functionality on a visual user interface. See FIG. 3A, for example.

In an alternative embodiment of the invention:
The employed detector is configured to comprise an annular detection surface sub-divided into multiple sectors of substantially equal area;
Said vector output is compiled by determining a weighted signal from different sectors. Such a set-up is essentially a derivative of a conventional quadrant detector, using an annular rather than "pie-shaped" detection surface. Seeing as the beam footprint on the detector plane will essentially be a disk, using an annular detection surface more easily allows signal collection from a particular sub-region of the footprint (as opposed to the entire footprint). In a further extension of this concept, the detector is configured to comprise a set of said annular detection surfaces, in nested concentric arrangement. In such a configuration, one can, for example, observe/predict how the beam footprint "sits" on the detector, and then elect to use detection signals from (one or more) annuli that are impinged upon by a desired sub-region of the footprint. See FIG. 3B, for example.

In either of the embodiments discussed in the previous two paragraphs, selection of a particular sub-region can comprise using an aperture plate in said flux between the specimen and detector. Such an aperture plate can be used to adjust the size/shape/location of a particular sub-region of the beam footprint that is allowed to impinge on the detector. The aperture plate may, for example:
Be an adjustable masking device, such as a diaphragm, or an XY selector similar to a set of reticle masking blades, for instance; and/or
Be movable into/out of said flux (beam path) using an exchanger mechanism, such as a carrousel, robot arm, etc. If desired, a selection of different aperture plates can be stored in a library/rack, allowing sub-regions of different size/shape/location to be selected by choosing a suitable aperture plate and positioning it appropriately between the specimen and detector.
An aperture plate as described here can also be used in conjunction with a "conventional" multi-sector detector (e.g. quadrant detector) to select a particular sub-region that is to be admitted to the detector.

In a particular embodiment of the invention:
The specimen under investigation comprises a variety of elemental constituents having a range of different atomic numbers (Z);
The selected sub-region of the beam footprint is chosen so as discriminatively register a sub-range of atomic numbers.
As already alluded to above, elements with higher Z-values tend to preferentially scatter further from the (nominal) particle-optical axis (center of the beam footprint on the detector) than elements with lower Z-values; consequently, separate iVF imaging of different radial sub-regions of the beam footprint (such as a central sub-region and a peripheral sub-region, for example) will tend to yield imagery that is (at least partially) "biased" toward a given sub-range of Z-values (such as relatively low Z and higher Z, for example). This effect can be exploited to more effectively image the various constituents of multifarious specimens: See FIGS. 4A-4D, for example.

In a further generalization of an embodiment as set forth in the previous paragraph, an iVF image obtained using a first sub-region of the beam footprint is combined with at least one of:

- An iVF image obtained using a second, different sub-region of the beam footprint;
- An iVF image obtained using the whole beam footprint;
- An Annular Dark Field image of the specimen.

The "composite image" resulting from such a combination tends to exploit the particular, individual imaging sensitivities of a variety of imaging modalities, and then "overlays" these to achieve a more-detailed compound image. See FIG. 4D, for example.

The skilled artisan will understand that the post-specimen beam footprint on an imaging detector in an STCPM is typically formed after passage of the beam through one or more clean-up apertures, whose purpose is, for example, to prevent parts of the beam from impinging on detection electronics, etc., along the periphery of the detector's detection surface. Such clean-up apertures typically only "shave off" a relatively minimal portion of the beam, and generally maximize the size of the admitted beam footprint on the available detection surface—thereby creating a "nominal" (or "default") beam footprint. The present invention may be regarded as concentrating on one or more sub-regions of this "nominal" beam footprint.

As a general remark, it should be noted that the mechanisms underlying the present invention could not be exploited if one were only to look at BF imagery (for example) rather than iVF imagery. In the present invention, an iVF image can be regarded as being a convolution of a Contrast Transfer Function (CFT) and an object-dependent Fourier Transform, whereby the CTF is basically object-independent. This CTF can, in principle, be adjusted so as to have no (or only few) zero-crossings—which helps avoid discontinuities (and associated artifacts). On the other hand, in BF imaging, one cannot speak in the same way of an object-independent CTF; instead, one has to deal with an object-dependent function, which cannot be optimized in the same way to minimize zeros.

The invention will now be elucidated in more detail on the basis of exemplary embodiments and the accompanying schematic drawings, in which:

FIG. 1 renders a longitudinal cross-sectional view of an embodiment of an STCPM in which the present invention is implemented.

In the Figures, where pertinent, corresponding parts may be indicated using corresponding reference symbols.

EMBODIMENT 1

Figure 1:
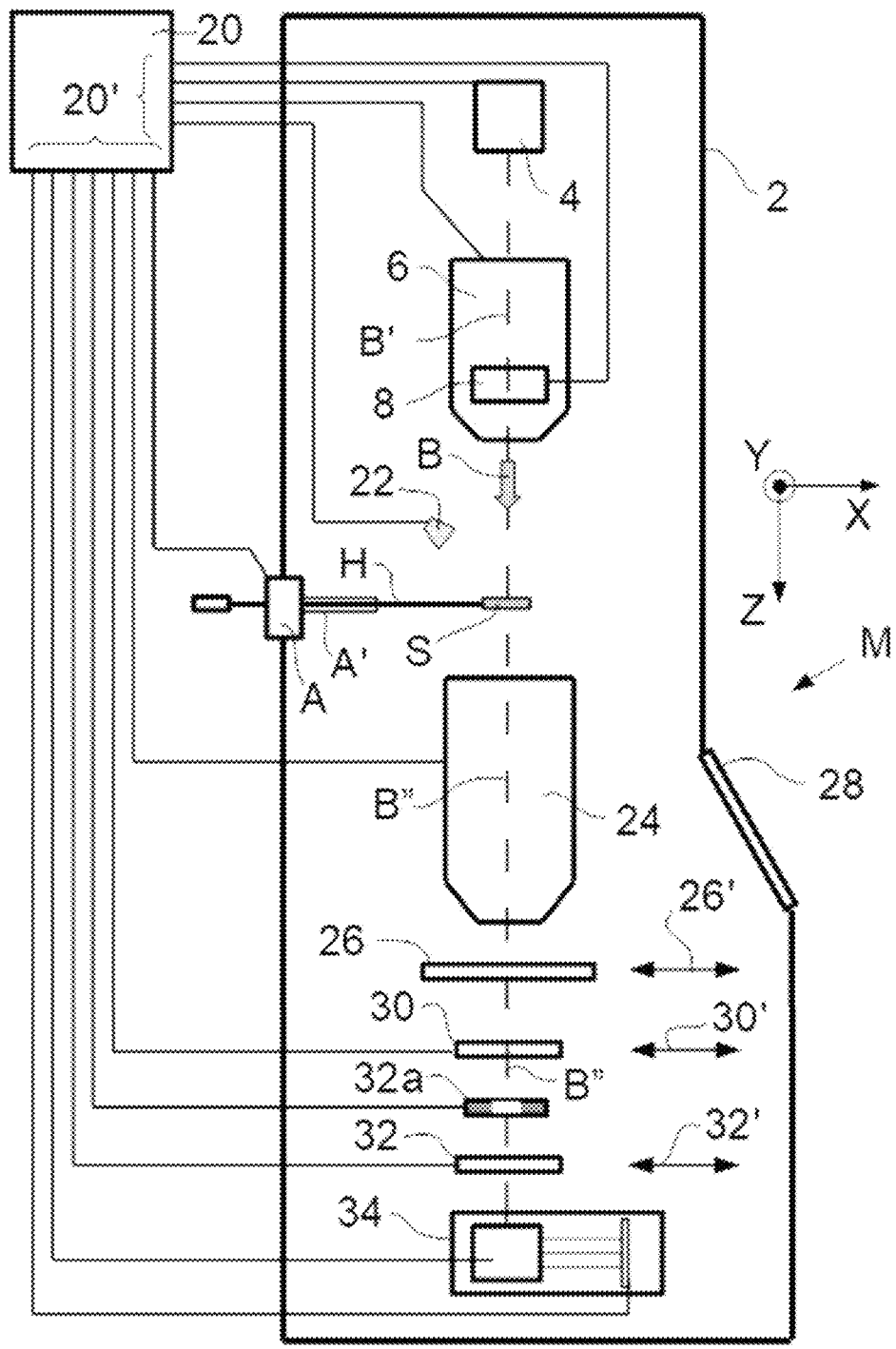

FIG. 1 (not to scale) is a highly schematic depiction of an embodiment of a Scanning Transmission Charged Particle Microscope (STCPM) M in which the present invention is implemented; more specifically, it shows a STEM (though, in the context of the current invention, it could just as validly be an ion-based microscope, for example). In the Figure, within a vacuum enclosure 2, an electron source 4 produces a beam B of electrons that propagates along an electron-optical axis B" and traverses an electron-optical illuminator 6, serving to direct/focus the electrons onto a chosen part of a specimen S (which may, for example, be (locally) thinned/planarized). Also depicted is a deflector system 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted coordinate system; typically, motion parallel to Z and tilt about X/Y will also be possible). Such movement allows different parts of the specimen S to be illuminated/imaged/inspected by the electron beam B traveling along axis B" (in the Z direction)—and/or allows scanning motion to be performed, as an alternative to beam scanning. If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of an analysis device 22, which might be a combined scintillator/photomultiplier or EDX (Energy-Dispersive X-Ray Spectroscopy) module, for instance; in such a case, an image could be constructed using basically the same principle as in a SEM. However, alternatively/supplementally, one can study electrons that traverse (pass through) the specimen S, exit/emanate from it and continue to propagate (substantially, though generally with some deflection/scattering) along axis B". Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B". An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of detector/analysis apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B".

STEM camera/detector 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B" (although such retraction would not be a necessity in the case of a donut-shaped Annular Dark Field (ADF) camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B", taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

In the particular context of iVF imaging, the following additional points deserve further elucidation:

The employed detector 32 (see FIG. 1) is embodied as a segmented detector, which, for example, may comprise a quadrant sensor, pixelated CMOS/CCD/SSPM detector, or PSD, for instance. Specific embodiments of such detectors are schematically shown in plan view in FIGS. 2A/2B and FIGS. 3A/3B, and will be discussed below.

Figure 2A:
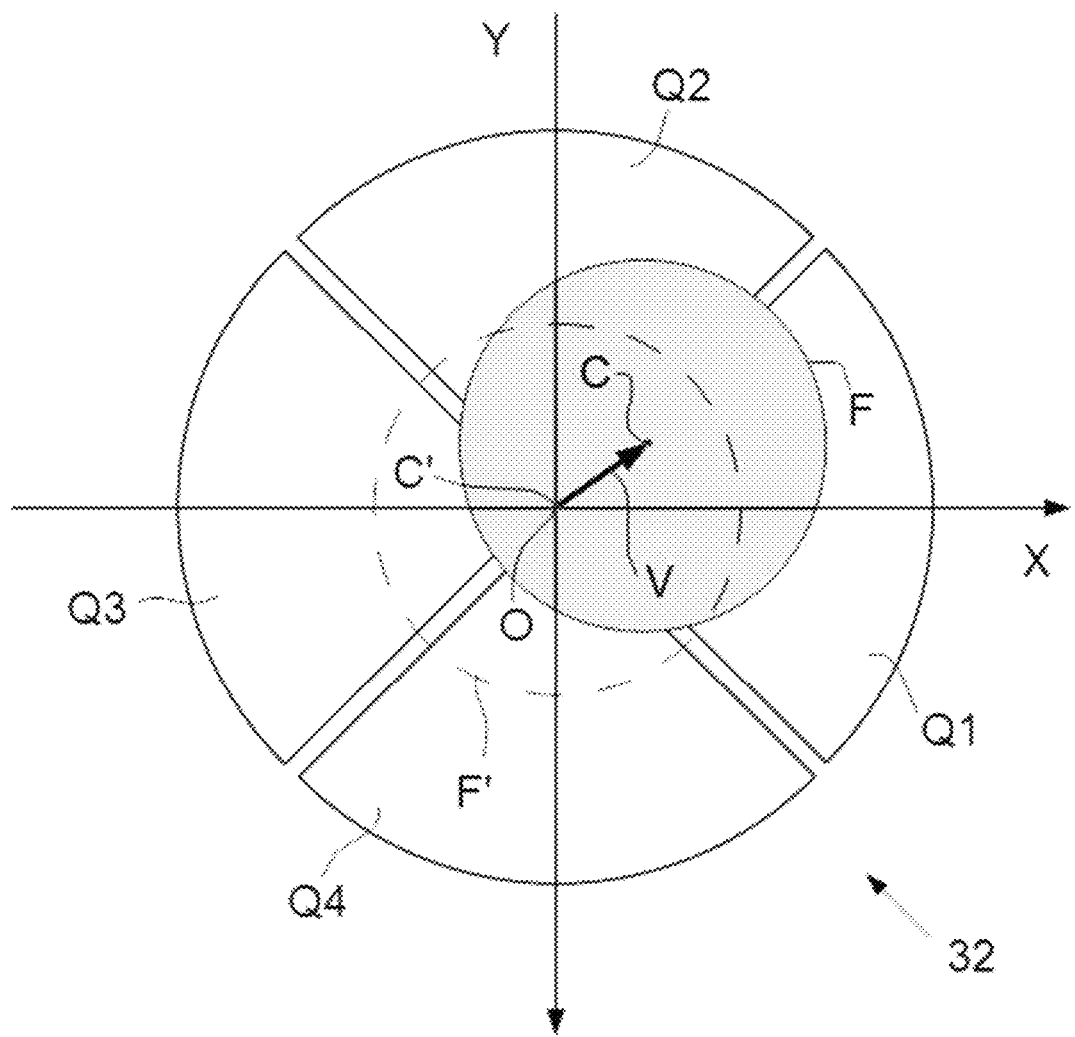
FIG. 2A depicts a plan view of a particular embodiment of a segmented detector (quadrant detector) that can be used in the subject of FIG. 1, in accordance with a conventional iVF imaging technique.

If a beam B propagating along particle-optical axis B" traverses the specimen S without undergoing any scattering/deflection in the specimen, then it will impinge (substantially) symmetrically on the center/origin O of the detector 32, and (essentially) give a "null" reading. This situation is shown in more detail in FIGS. 2A and 2B, which show coordinate axes X, Y with an origin at point O, on which is centered a dashed circle that schematically represents an impingement footprint F' of a (ghost) charged-particle beam B with intensity barycenter C', such that:

In FIG. 2A, this footprint F' is symmetrically overlaid on detection quadrants (electrodes) Q1, Q2, Q3, Q4. If the detection signals (electrical currents) from these quadrants are respectively denoted by S1, S2, S3, S4, then this situation will yield zero difference signals S1-S3 and S2-S4 between opposing pairs of quadrants.

Figure 2B:
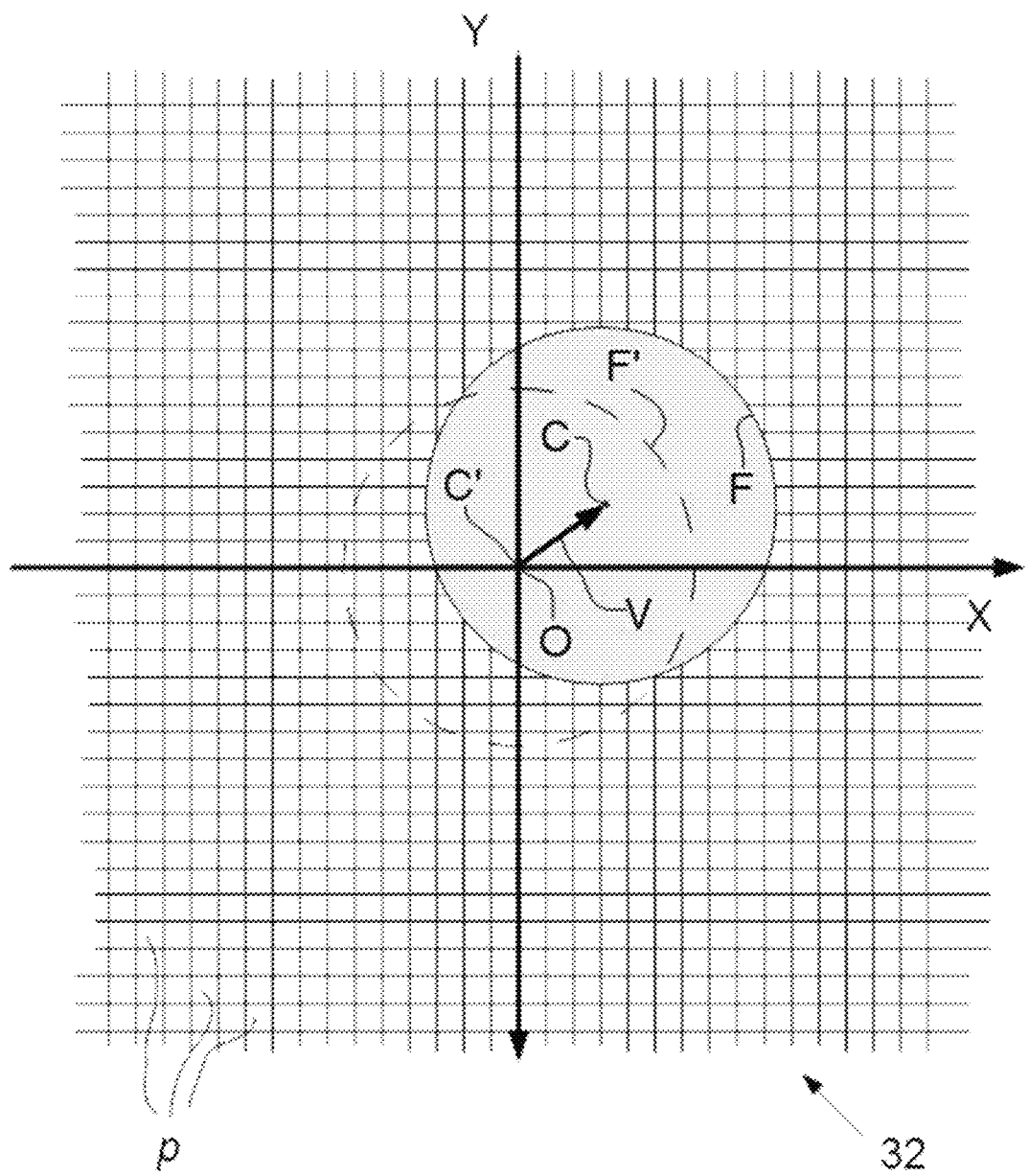
FIG. 2B depicts a plan view of another embodiment of a segmented detector (pixelated detector) that can be used in the subject of FIG. 1, in accordance with another conventional iVF imaging technique.

In FIG. 2B, which depicts an orthogonal matrix of detection pixels p (e.g. in a CMOS detector, possibly with an overlaid scintillation layer), there is zero deviation between the elected origin O of said pixel matrix and intensity barycenter C'.

Figure 5A:
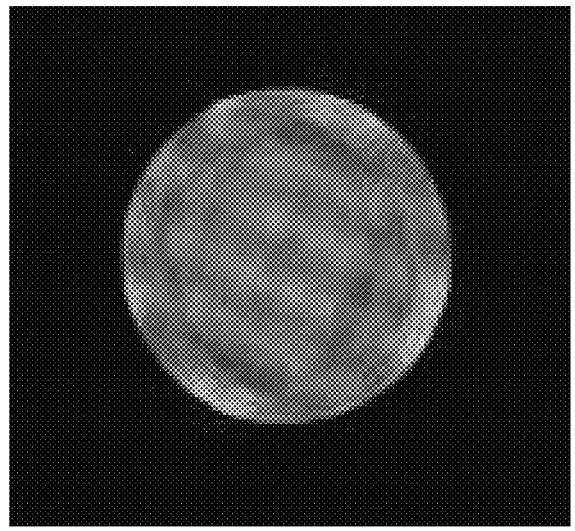
FIGS. 5A and 5B show CBED disks for two different specimens, clearly showing internal intensity inhomogeneity.
Figure 5B:
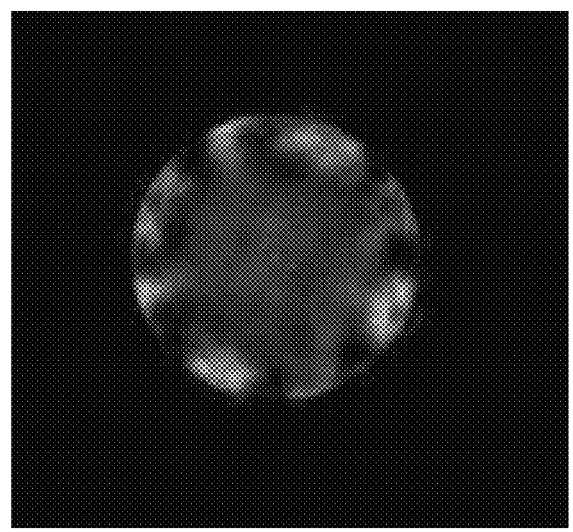

If, on the other hand, charged-particle beam B undergoes some scattering/deflection in the specimen S, it will land on the detector 32 at a position displaced from the origin O and/or a distribution of intensity within its cross-section will change (see FIGS. 5A, 5B, for reference purposes). In this context, FIGS. 2A and 2B schematically illustrate a beam footprint F with intensity barycenter C that is no longer centered on O. The position of point C with respect to O defines a vector V, with an associated magnitude (length) and direction (pointing angle with respect to X axis, for example). This vector V can be expressed in terms of the coordinates $(X_C, Y_C)$ of point C, which can be distilled as follows:

In FIG. 2A, one can derive (rudimentary) estimators for $X_C$, $Y_C$ using the following formulae:

$$X_C \sim \frac{S1-S3}{S1+S2+S3+S4}, Y_C \sim \frac{S2-S4}{S1+S2+S3+S4} \quad (1)$$

The term in the denominator can be (more correctly) replaced by the total charged particle dose at every pixel position; however, when absorption effects in the specimen are relatively insignificant (as for thin specimens, for example), this total dose will essentially be the same as the denominator in equation (1) [or proportional to it, in the case of absorption that does not significantly vary on a pointwise basis].

In FIG. 2B, one can derive values for $X_C$, $Y_C$ by examining output signals from the various pixels p, because pixels p that are impinged upon by the beam footprint F will give a different output signal (electrical resistance, voltage or current, for example) to pixels p outside the footprint F. The location of C can then be directly deduced by noting the coordinates of that particular pixel that yields an extremal signal, or indirectly determined by mathematically calculating the intensity barycenter of the cluster of pixels p impinged on by B, or via a hybrid technique that combines both approaches, for example.

The skilled artisan will understand that the size of beam footprint F can be altered by adjusting the so-called "camera length" of the STCPM of FIG. 1, for example.

As beam B is scanned across the specimen S so as to trace out a two-dimensional scan path (area), the approach set forth in the previous item can be used to obtain a value of V for each coordinate position along said scan path. This allows compilation of a "map" of vector V as a function of scan position on the specimen S, which amounts to a mathematical field (and also a physical field, in that the vector V can be assigned a (proportional) physical meaning, such as electrostatic field vector).

The vector field resulting from the previous step can now be integrated two-dimensionally, so as to obtain an integrated vector field (iVF) image (which represents a map of electrostatic potential in specimen S).

More information on these (and related) aspects can be gleaned from the abovementioned U.S. Pat. No. 9,312,098, for example.

Figure 3A:
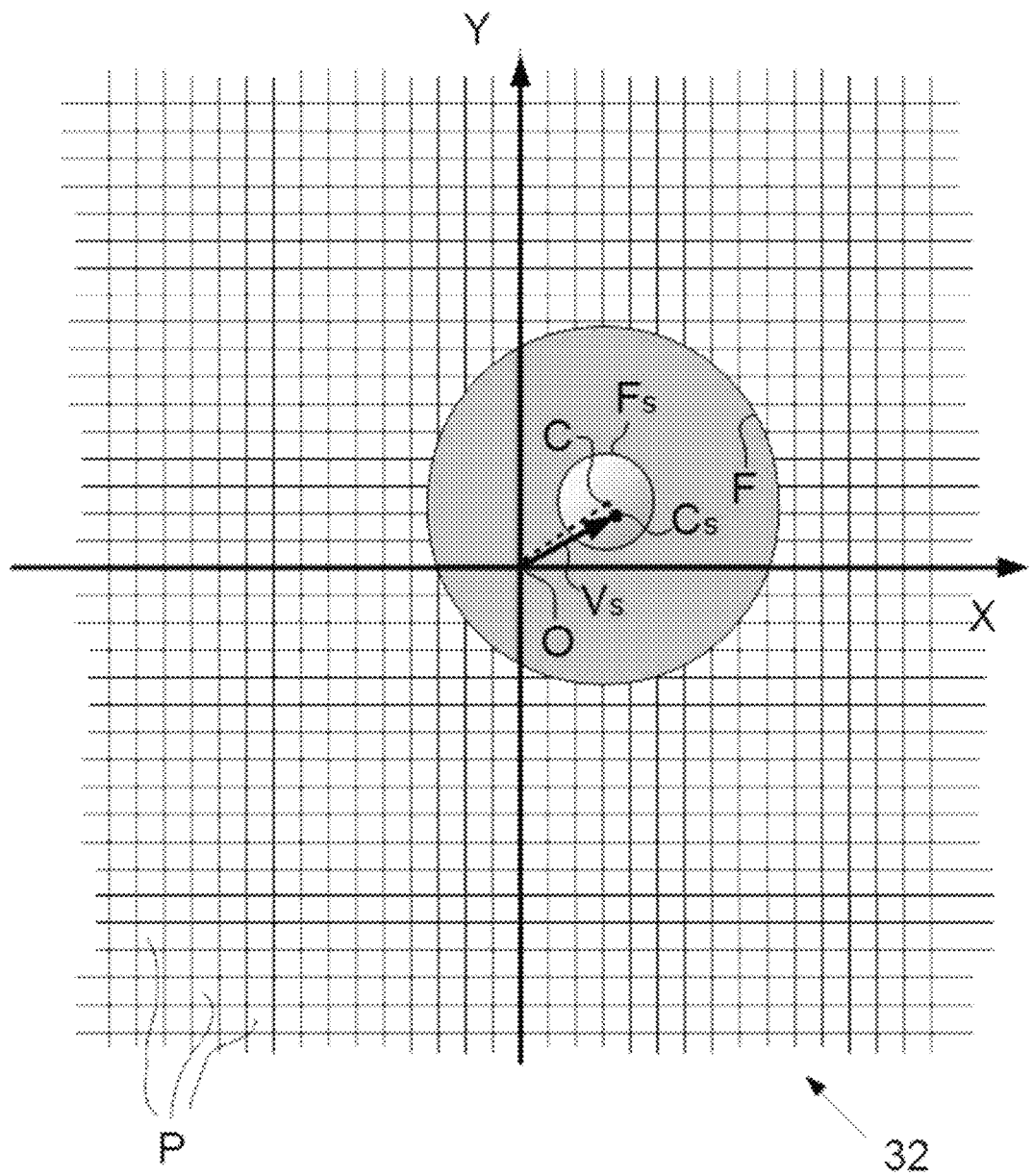
FIG. 3A shows a modification of the subject of FIG. 2B, in accordance with an embodiment of the present invention.
Figure 3B:
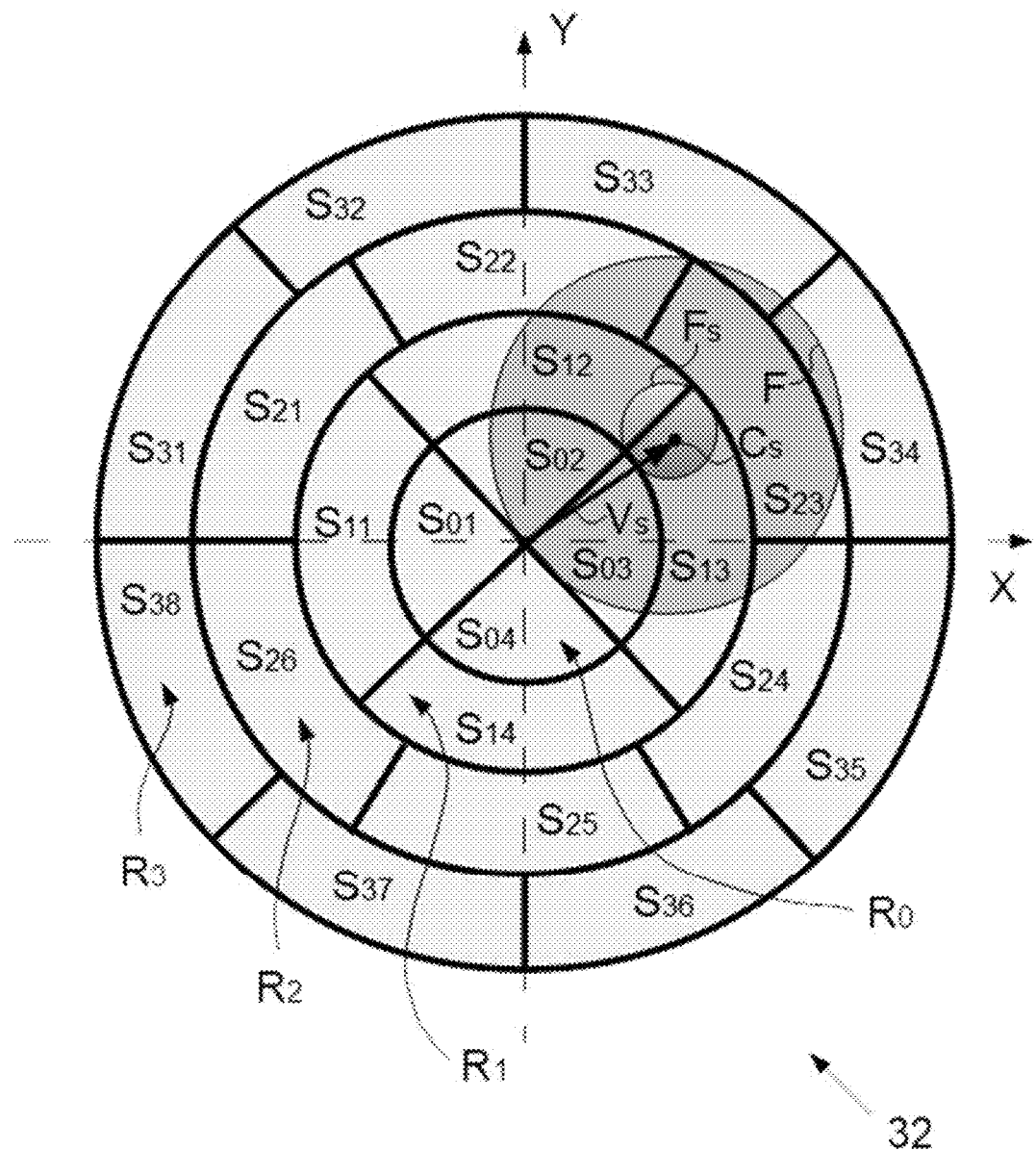
FIG. 3B shows a modification of the subject of FIG. 2A, in accordance with another embodiment of the present invention.

Turning now to FIGS. 3A and 3B, these show modifications of FIGS. 2B and 2A, respectively, in accordance with embodiments of the present invention. More specifically:

Starting with FIG. 3A, this shows a (centrally located) sub-region $F_S$ of the footprint F, with an associated intensity barycenter $C_S$ and vector $V_S$ (connecting origin O to $C_S$). Since, as already mentioned above, footprint F (and sub-region $F_S$) generally do not have a homogeneous/isotropic intensity distribution, barycenter $C_S$ of sub-region $F_S$ will generally not coincide with barycenter C of footprint F, and vector $V_S$ will therefore generally not equal vector V in FIG. 2B. The barycenter $C_S$ of sub-region $F_S$ can be determined by calculating a weighted sum of the output of the pixels underlying sub-region $F_S$. Note that the detector in FIG. 3A can be essentially identical to that FIG. 2B—in essence, the only difference between the Figures concerns the (specific parameter values of the) selection algorithm used to elect the size/shape/position of the sub-region $F_S$ and determine its intensity barycenter $C_S$.

FIG. 3B schematically illustrates a modification of the architecture of the detector in FIG. 2A. More specifically, FIG. 3B shows a set $R_1$, $R_2$, $R_3$ of individually selectable annular detection surfaces in nested concentric arrangement, each annular detection surface $R_i$ being sub-divided into multiple sectors $\{S_{i1}, S_{i2}, S_{i3}, \ldots\}$ of substantially equal area (though this does not necessarily have to be the case). In the middle of this nested arrangement is a pie-shaped detection surface $R_0$, with four quadrant-shaped sectors $S_{01}$, $S_{02}$, $S_{03}$, $S_{04}$, which is similar to the set-up of FIG. 2A; since $R_0$ is effectively an annulus with inner radius zero, all four of the detector zones $R_0$, $R_1$, $R_2$, $R_3$ can be referred to here as annuli. One or more of annuli $R_0$, $R_1$, $R_2$, $R_3$ can be selected at will to act as detection surfaces and, within a given annulus $R_i$, the outputs from constituent sectors $\{S_{ij}\}$ can be individually read out. Note that, in the current architecture:

Each of annuli $R_0$, $R_1$ has four sectors;
Annulus $R_2$ has six sectors;
Annulus $R_3$ has eight sectors, though this does not necessarily have to be the case, and other choices are possible (e.g. depending on the selected inner/outer radius values of each annulus). It should also be noted that the various annuli do not necessarily have to have the same radial extent (outer radius minus inner radius).

Analogous to the situation in FIG. 3A, FIG. 3B shows a (centrally located) sub-region $F_S$ of the footprint F, with an associated intensity barycenter $C_S$ and vector $V_S$ (connecting origin O to $C_S$); such a sub-region $F_S$ may, for example, be selected using an appropriate (adjustable and/or retractable) aperture plate/spatial filter, such as plate 32a in FIG. 1, for example. Again, since footprint F/sub-region $F_S$ generally do not have a homogeneous/isotropic intensity distribution, barycenter $C_S$ of sub-region $F_S$ will generally not coincide with barycenter C of footprint F, and vector $V_S$ will therefore generally not equal vector V (see FIG. 2A). As here illustrated, sub-region $F_S$ falls within the boundaries of annulus $R_1$, but this does not necessarily have to be the case, and it could instead straddle multiple annuli. Analogous to the situation in Equation (1) above, one can therefore calculate (rudimentary) estimators $(X_{CS}, Y_{CS})$ for $V_S$ using the following formulae:

$$X_{CS} \sim \frac{S13 - S11}{S11 + S12 + S13 + S14}, Y_{CS} \sim \frac{S12 - S14}{S11 + S12 + S13 + S14} \quad (1a)$$

More generally, one can determine a weighted signal from the different sectors $\{S_{ij}\}$ in an annulus $R_i$ on which the sub-region $F_S$ is superimposed, e.g. based on the output voltage or current from each respective sector. Note that other annuli could be used to study other, different sub-regions: for example, annulus $R_2$ could be used to investigate a sub-region near the outer periphery [larger (X, Y)] of footprint F, whereas annulus $R_0$ could be used to investigate a sub-region near the inner periphery [smaller (X, Y)] of footprint F, for instance.

As a general note, it should be realized that the magnitudes of displacements shown in FIGS. 2 and 3 (e.g. the difference between F' and F; C and $C_S$; V and $V_S$) are somewhat exaggerated, so as to clearly illustrate the underlying effects, which may be of small magnitude.

EMBODIMENT 2

Figure 4A:
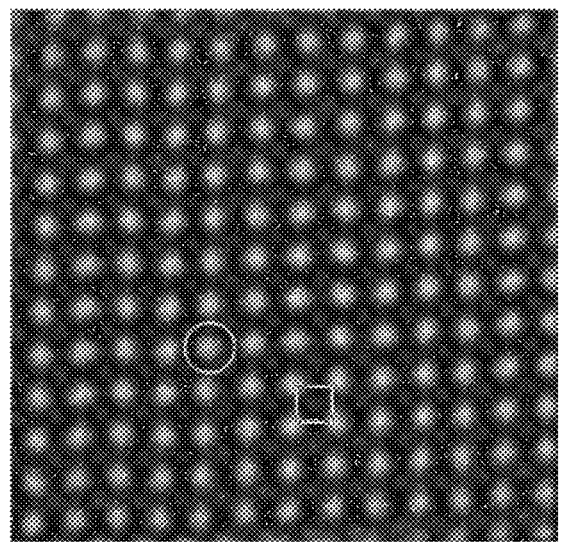
FIGS. 4A, 4B, 4C and 4D show various STCPM images of an $SrTiO_3$ crystal, and illustrate various aspects of an embodiment of the present invention.

FIGS. 4A, 4B, 4C and 4D show various STCPM images of an SrTiO$_3$ (strontium titanate) crystal, and illustrate various aspects of an embodiment of the present invention. SrTiO$_3$ has a so-called perovskite structure, and the atomic numbers (Z) of its various constituents are Sr=38, Ti=22 and O=8. More specifically:

FIG. 4A shows a "standard" iVF image, made without concentrating on a particular sub-region of the beam footprint, which will here be taken to have a radius $r_0$ (which may, for example, be defined as a radius value at which the footprint intensity falls below a given threshold, e.g. 10% of a bright-dark differential value). The low-Z oxygen atoms (see white square, for example) are relatively faint, whereas the high-Z Sr/Ti atoms (see white circle, for example) are relatively bright. There is no clear distinction between Sr and Ti in this image.

Figure 4B:
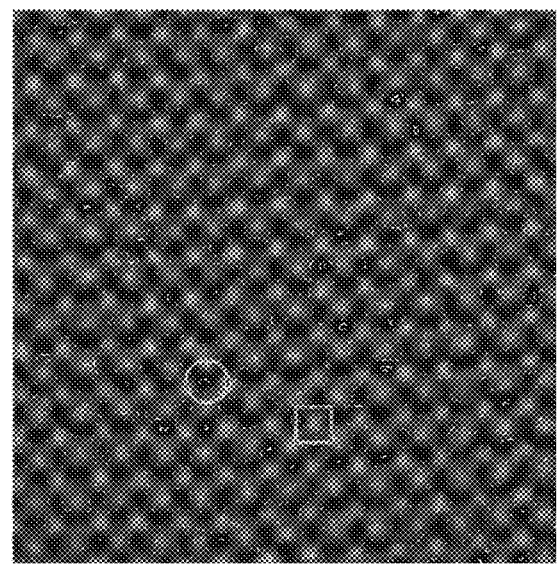

FIG. 4B shows an iVF image made according to the present invention, derived from concentrating on a sub-region of the beam footprint—in this case a central disk of radius $0.3r_0$. The low-Z oxygen atoms (e.g. in white square) are now relatively bright, whereas the high-Z Sr/Ti atoms (e.g. in white circle) are relatively faint. Once again, there is no clear distinction between Sr and Ti in this image.

Figure 4C:
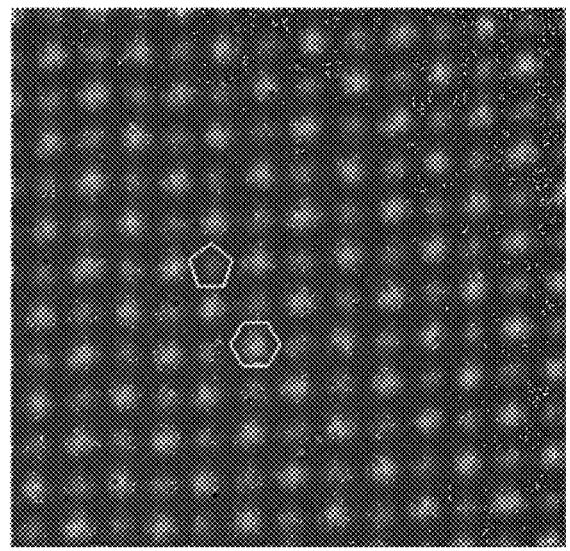

FIG. 4C shows an Annular Dark Field (ADF) image, made at $r>r_0$, e.g. by embodying detector 30 in FIG. 1 as an ADF detector. This image has less "depth" than the images in FIGS. 4A and 4B, but it more clearly shows the distinction between the Sr and Ti atoms (see white pentagon/hexagon, for example).

Figure 4D:
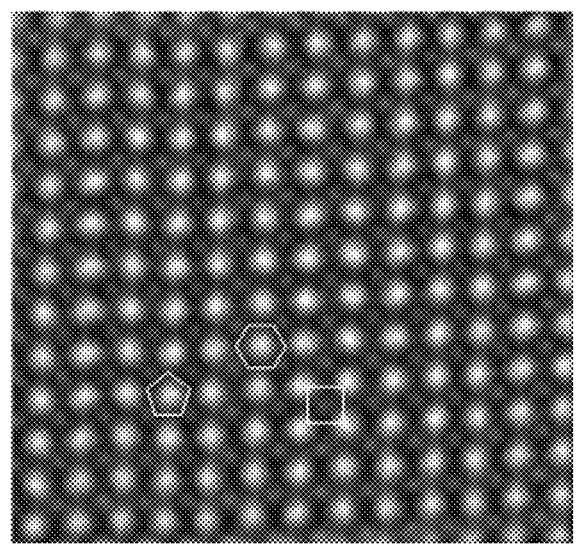

FIG. 4D is a composite image, obtained by combining (e.g. summing corresponding pixel values of) the images in FIGS. 4A, 4B and 4C. Note that the three different types of atoms in the crystal—St, Ti and O—are clearly distinguishable from one another in this color image.

EMBODIMENT 3

FIGS. 5A and 5B show CBED disks (beam footprints) for two different specimens, clearly showing internal intensity inhomogeneity. Both disks relate to GaN [110], but the specimen in FIG. 5A was 2.4 nm thick, whereas that in FIG. 5B was 7.5 nm thick; in both cases, the primary (incoming) electron beam was focused at a sub-surface depth of 2 nm. The Figures clearly show intensity "fringes" within the disks, and clarify how/why one will generally obtain different intensity barycenters when one considers different sub-regions of each disk.

The invention claimed is:

1. A method of imaging a specimen in a Scanning Transmission Charged Particle Microscope, comprising the following steps:
   providing a beam of charged particles directed from a source through an illuminator so as to irradiate a specimen;
   providing a segmented detector for detecting a flux of charged particles traversing the specimen, which flux forms a beam footprint on said detector;
   causing said beam to scan across a surface of the specimen, combining signals from different segments of the detector so as to produce a vector output from the detector at each scan position, and compiling this data to yield an imaging vector field; and
   mathematically processing said imaging vector field by subjecting it to a two-dimensional integration operation, thereby producing an integrated vector field image of the specimen, wherein
   using a confined sub-region of said beam footprint to produce said vector output, the imaging vector field and integrated vector field image.

2. A method according to claim 1, wherein:
   said detector is embodied as a pixelated detector comprising an array of pixels;
   said vector output is compiled by:
      comparing pixel values to determine a location for an intensity barycenter of said sub-region of the beam footprint on the detector; and
      expressing coordinate positions of said barycenter on the detector.

3. A method according to claim 1, wherein:
   said detector is configured to comprise an annular detection surface sub-divided into multiple sectors of substantially equal area; and
   said vector output is compiled by determining a weighted signal from different sectors.

4. A method according to claim 3, wherein said detector is configured to comprise a set of said annular detection surfaces, in nested concentric arrangement.

5. A method according to claim 1, wherein selection of said sub-region comprises using an aperture plate in said flux between the specimen and detector.

6. A method according to claim 1, wherein:
   said specimen comprises a variety of elemental constituents having a range of different atomic numbers; and
   said sub-region of the beam footprint is selected so as to discriminatively register a sub-range of atomic numbers.

7. A method according to claim 6, wherein:
   said sub-region of the beam footprint is a confined central region of said footprint; and
   said sub-range of atomic numbers comprises relatively low atomic numbers.

8. A method according to claim 6, wherein:
   said sub-region of the beam footprint is a confined peripheral region of said footprint; and
   said sub-range of atomic numbers comprises relatively high atomic numbers.

9. A method according to claim 1, wherein:
   in a first imaging session, a first sub-region is used to as a basis to produce a first integrated vector field image; and
   in a second imaging session, a second, different sub-region is used to as a basis to produce a second integrated vector field image.

10. A method according to claim 1, wherein an integrated vector field image obtained using a first sub-region of the beam footprint is combined with at least one of:
    an integrated vector field image obtained using a second, different sub-region of the beam footprint;
    an integrated vector field image obtained using the whole beam footprint; and
    an Annular Dark Field image of the specimen.

11. A Scanning Transmission Charged Particle Microscope, comprising:
    an illuminator, for directing a beam of charged particles from a source onto a specimen;
    a segmented detector, for detecting a flux of charged particles traversing the specimen, which flux forms a beam footprint on said detector; and
    a controller configured to:
       effect scanning motion of said beam across a surface of the specimen;
       combine signals from different segments of said detector so as to produce a vector output from the detector at each scan position, and compile this data to yield an imaging vector field;
       mathematically process said imaging vector field by subjecting it to a two-dimensional integration operation, thereby producing an integrated vector field image of the specimen; and
       use a confined sub-region of said beam footprint to produce said vector output, and the attendant imaging vector field and integrated vector field image.

12. A detector assembly for detecting charged particles, comprising:
    a set of individually selectable annular detection surfaces in nested concentric arrangement, each annular detection surface being sub-divided into multiple sectors of substantially equal area; and
    a processor configured to compile a vector output by calculating a weighted signal from different sectors, and to process said vector by subjecting it to a two-dimensional integration operation.

* * * * *